United States Patent
Agrawal et al.

(10) Patent No.: US 11,164,785 B2
(45) Date of Patent: Nov. 2, 2021

(54) THREE-DIMENSIONAL INTEGRATED CIRCUITS (3DICS) INCLUDING UPPER-LEVEL TRANSISTORS WITH EPITAXIAL SOURCE AND DRAIN MATERIAL

(71) Applicant: Intel Corporation, Santa Clara, CA (US)

(72) Inventors: Ashish Agrawal, Hillsboro, OR (US); Gilbert Dewey, Hillsboro, OR (US); Cheng-Ying Huang, Hillsboro, OR (US); Willy Rachmady, Beaverton, OR (US); Anand Murthy, Portland, OR (US); Ryan Keech, Portland, OR (US); Cory Bomberger, Portland, OR (US)

(73) Assignee: Intel Corporation, Santa Clara, CA (US)

(*) Notice: Subject to any disclaimer, the term of this patent is extended or adjusted under 35 U.S.C. 154(b) by 31 days.

(21) Appl. No.: 16/728,903

(22) Filed: Dec. 27, 2019

(65) Prior Publication Data

US 2021/0202319 A1    Jul. 1, 2021

(51) Int. Cl.
| | | |
|---|---|---|
| H01L 21/822 | (2006.01) | |
| H01L 27/12 | (2006.01) | |
| H01L 29/08 | (2006.01) | |
| H01L 23/522 | (2006.01) | |
| H01L 29/417 | (2006.01) | |
| H01L 21/8238 | (2006.01) | |

(52) U.S. Cl.
CPC .. *H01L 21/8221* (2013.01); *H01L 21/823814* (2013.01); *H01L 23/5226* (2013.01); *H01L 27/1207* (2013.01); *H01L 29/0847* (2013.01); *H01L 29/41733* (2013.01)

(58) Field of Classification Search
CPC ......... H01L 21/8221; H01L 21/823814; H01L 23/5226; H01L 27/1207; H01L 29/0847; H01L 29/41733
USPC ....................................................... 257/347
See application file for complete search history.

(56) References Cited

U.S. PATENT DOCUMENTS

| | | | |
|---|---|---|---|
| 9,368,512 B1* | 6/2016 | Cheng ................ | H01L 29/6653 |
| 9,685,436 B2 | 6/2017 | Morrow et al. | |
| 2004/0007724 A1* | 1/2004 | Murthy ............ | H01L 29/66772 257/288 |
| 2013/0270512 A1* | 10/2013 | Radosavljevic .... | H01L 21/8258 257/9 |
| 2018/0090582 A1* | 3/2018 | Adusumilli ..... | H01L 21/823821 |

(Continued)

*Primary Examiner* — Tong-Ho Kim
(74) *Attorney, Agent, or Firm* — Green, Howard & Mughal LLP

(57) ABSTRACT

A monolithic three-dimensional integrated circuit may include multiple transistor levels separated by one or more levels of metallization. An upper level transistor structure may include monocrystalline source and drain material epitaxially grown from a monocrystalline channel material at a temperature low enough to avoid degradation of a lower level transistor structure and/or degradation of one or more low-k dielectric materials between the transistor levels. A highly conductive n-type silicon source and drain material may be selectively deposited at low temperatures with a high pressure CVD process. Multiple crystals of source drain material arranged in a vertically stacked multi-channel transistor structure may be contacted by a single contact metallization.

15 Claims, 8 Drawing Sheets

(56) References Cited

U.S. PATENT DOCUMENTS

2018/0331232 A1\* 11/2018 Frougier ........... H01L 29/42392
2019/0035889 A1\* 1/2019 Mohapatra ........ H01L 21/02549
2020/0126987 A1\* 4/2020 Rubin ............... H01L 21/76897

\* cited by examiner

THREE-DIMENSIONAL INTEGRATED CIRCUITS (3DICS) INCLUDING UPPER-LEVEL TRANSISTORS WITH EPITAXIAL SOURCE AND DRAIN MATERIAL

BACKGROUND

Demand for integrated circuits (ICs) in portable electronic applications has motivated greater levels of semiconductor device integration. A 3-dimensional (3D) IC may be assembled from multiple monolithic die, or a 3DIC may be monolithically fabricated. Relative to assembly-based techniques, monolithic 3DIC fabrication holds the promise of denser architectures. One difficulty however is the relatively low temperature (e.g., below 450° C.) processing needed to ensure monolithic fabrication of a subsequent device level does not degrade the performance of a previously fabricated device level.

Even assuming a device semiconductor material suitable for a transistor channel is successfully formed upon a host substrate that includes another device semiconductor layer, the further fabrication of transistor source and drain semiconductor material poses a challenge. For example, source and drain semiconductor material needs electrically active dopants for such transistors to have good (low) external resistance. Dopants may be introduced into source and drain semiconductor material with ion implantation followed by thermally driven activation. Alternatively, dopants may be introduced during source/drain material deposition. While both of these techniques have been successfully employed in conventional CMOS transistor technology, such techniques have not been well-suited for monolithic 3D-IC integration because of the high temperatures typically required during either an activation anneal or an in-situ doped material deposition process.

Low temperature techniques for forming source and drain semiconductor material of low resistivity, and associated device structures, suitable for monolithic 3DIC integration of CMOS transistors would therefore be commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
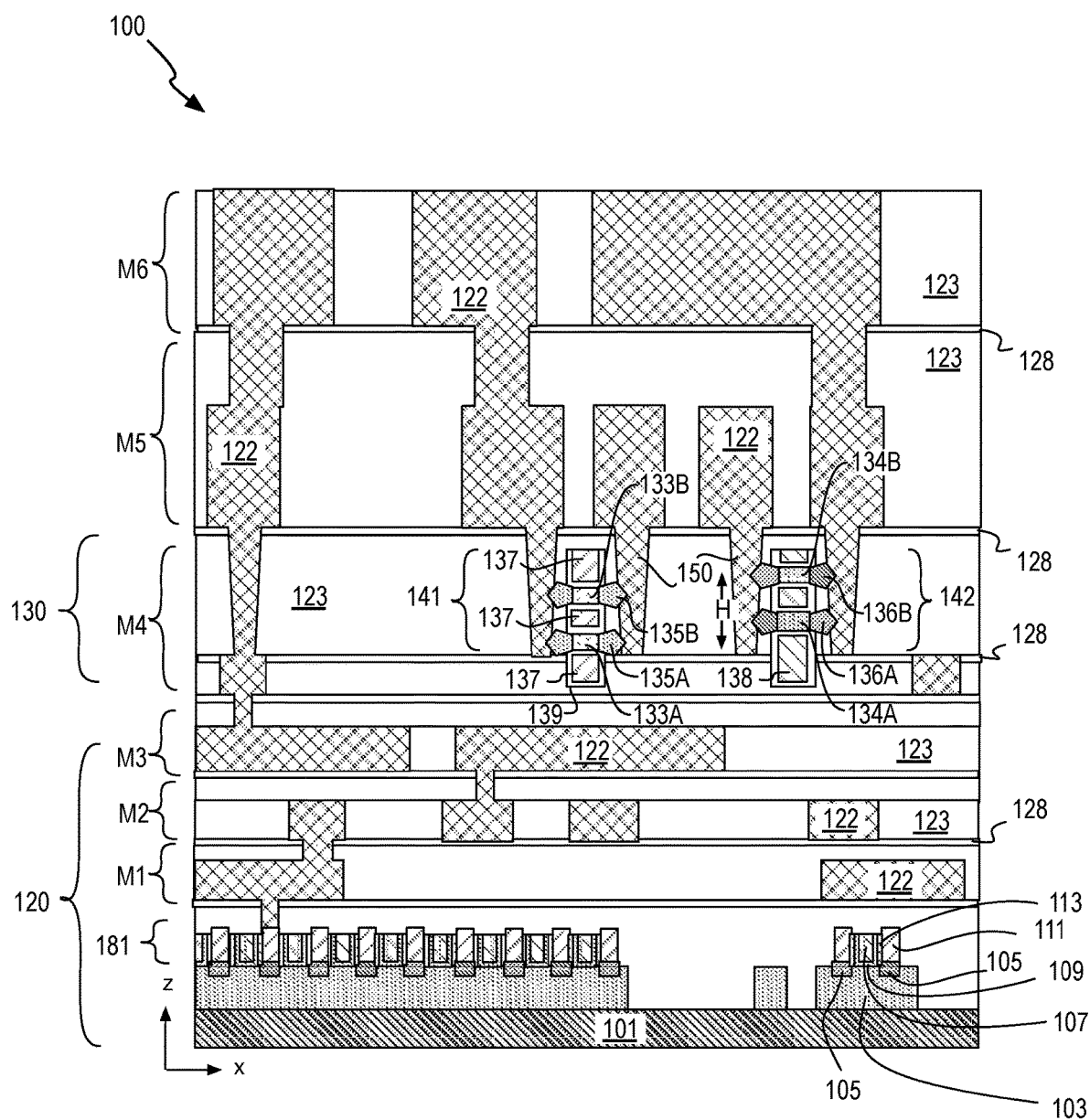
FIG. 1 illustrates a cross-sectional view of a monolithic 3DIC structure including upper-level transistors over lower-level integrated circuitry, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

In accordance with some embodiments herein, upper level transistor structures include epitaxially grown, impurity-doped source and drain material. Methods of fabricating such structures over lower-level integrated circuitry are described in accordance with some further embodiments. Source and drain material having low electrical resistance can reduce parasitic external resistance ($R_{ext}$) associated with a transistor structure. In front-end CMOS technology, source/drain structures having low electrical resistance can be fabricated by a high temperature epitaxial growth (e.g., >800° C.), or ion implantation followed by a high temperature thermal activation. As noted above however, such techniques are generally not suitable for upper-level transistors that are integrated in the back-end of line (BEOL) of a monolithic 3DIC fabrication process because such high temperature processing in the back-end can detrimentally impact the performance and reliability of any previously fabricated transistors (e.g., those in FEOL circuitry, or at a lower level of BEOL circuitry). High temperature processing may also degrade dielectric materials employed within one or more levels of BEOL interconnect metallization that may be present between levels of transistors. For example, when subsequent processing temperatures exceed a threshold temperature, low-k dielectrics (e.g., having a relative permittivity below about 3.5) can become "fluffy" as a result of void formation.

In accordance with some embodiments described herein, low-temperature (e.g., <450° C.) processes are employed to epitaxially grow an in-situ doped source and drain material from a monocrystalline seeding surface of channel material. The low temperature growth may be facilitated by the seeding surface to selectively grow source and drain material having a high dopant concentration. The concentration of electrically active dopants within such epitaxial source and drain material may be much higher than within the channel material. Through the introduction of impurity-doped source or drain material, impurities within the channel material may minimized. As such, the upper-level transistors structures described herein may have significantly higher channel mobility than a transistor structure that otherwise includes more impurity dopants throughout the channel material, for example for the sake of achieving lower source and drain contact resistance. The upper-level transistor structures including selectively grown source or drain material in accordance with embodiments herein may also display significantly lower $R_{ext}$ than a transistor structure that instead relies on the formation of a Schottky junction between source and drain contact metallization and a channel material (e.g., that is lightly doped), or that relies on polycrystalline source and drain material having a lower activated dopant concentration.

Notably, the structures and techniques described herein may leverage the presence of a substantially monocrystalline channel material from which source and drain material may be grown. Such monocrystalline channel material is still referred to in herein as a "thin film" to distinguish it from a FEOL transistor channel material that is also monocrystalline but is a layer of a thicker handling substrate. As such, an upper-level, or BEOL, transistor in accordance with embodiments herein may also be referred to herein as a "thin film transistor (TFT)" to distinguish it from a lower-level FEOL transistor fabricated within a starting substrate.

In accordance with embodiments herein, the upper-level transistors are referred to herein as being "monolithic" with the lower-level transistors to distinguish a monolithic 3DIC from a composite 3DIC that instead comprises preforms that have been joined, for example through bonding, or other means. In a composite 3DIC, a first preformed die including a pre-fabricated first (e.g., lower-level) transistor and/or integrated circuit is joined to a second preformed die that also includes a pre-fabricated second (e.g., upper-level) transistor and/or integrated circuit. In a monolithic 3DIC, a second (e.g., upper-level) transistor and/or integrated circuit is fabricated directly upon a first (e.g., lower-level) transistor and/or integrated circuit. Because such direct fabrication of the upper-level transistor and/or integrated circuit will permit finer alignment between the upper-level and the lower-level transistors and/or integrated circuits, a monolithic 3DIC may achieve higher IC density than a composite 3DIC.

The formation of a monolithic 3DIC through direct fabrication of an upper-level transistor and/or integrated circuit according to embodiments herein does not preclude joining of preforms per se. However, at least one of the preforms so joined are to include only unpatterned material(s) such that the joining is merely an alternative to a blanket film deposition process. For example, an unpatterned material film may be transferred from a donor substrate to a host substrate (e.g., at the wafer level). From there, direct fabrication may proceed with a subsequent patterning of the transferred film (e.g., on the host substrate). In contrast to the density limitation that may be imposed by joining one patterned preform to another patterned preform, unpatterned film layer transfers pose no limitation to the density of a monolithic 3DIC.

For some exemplary embodiments described further below, source and drain materials are formed during direct fabrication of an upper-level transistor. The source and drain materials are formed with an epitaxial growth process, for example from a seeding surface of a substantially monocrystalline channel material. The epitaxial growth process employed to form source and drain crystals is conducted at a low temperature (e.g., not to exceed 450° C., advantageously below 400° C.) to ensure lower-level transistors and/or circuitry is not significantly degraded. Because the epitaxial source/drain growth is performed as part of a monolithic fabrication process, very fine source/drain pitches (e.g., 40-125 nm) may be achieved on transistors having channel regions precisely aligned to lower-level circuitry.

Depending on the semiconductor materials chosen for the channel material and/or the source and drain material, epitaxial growth of source and drain material may be more or less challenging as some compositions, such as those with Ge and/or Sn, have an advantage of a low energy of substitution of dopants into the microstructure of the source and/or drain material, resulting in superior dopant activation at low temperatures so that a greater fraction of chemical impurities introduced as dopants become electrically active. Ge and/or Sn semiconductor alloys are therefore good options for upper-level (BEOL) PMOS field effect transistors (FETs) wherein p-type source and drain material may advantageously include at least one of Ge or Sn as majority constituents, into which certain p-type dopants, such as, but not limited to, B or Ga, may be readily substituted at low temperatures.

For some PMOS transistor embodiments, the channel material does not include either Ge or Sn, or if it does, at least not to the same extent as the source and drain material. For example, a PMOS upper-level transistor with p-type source and drain material including at least one of Ge or Sn impurity doped with B or Ga, may have a channel material that comprises Si and/or SiGe alloy. As described further below, in some alternative upper-level PMOS transistors channel material might also comprise Group III and Group V lattice constituents (e.g., GaSb, InGaSb alloys), or even a metal oxide comprising predominantly oxygen and one or more metals (e.g., $CuO_x$). In such alternative embodiments, the p-type source and drain material may again include at least one of Ge or Sn, but other alternatives (e.g., any Group III-V alloy that can be epitaxially grown from the seeding channel material) are also possible.

In some embodiments, for example where upper-level circuitry is complementary metal-oxide-semiconductor (CMOS), at least some upper-level transistors are NMOS. For NMOS upper-level transistors, n-type source and drain material is also to be epitaxially grown from a seeding channel material. In some advantageous embodiments, the seeding channel material for n-type source and drain material is substantially the same as the seeding channel material of p-type source and drain material. For example, in some embodiments where a PMOS upper-level transistor has a Group IV channel material (e.g., Si), the NMOS upper-level transistor also has a Group IV channel material (e.g., Si). While such embodiments may be ideally matched to underlying circuitry that may also comprise silicon-channeled CMOS circuitry, low-temperature epitaxial growth of n-type source and drain material poses a challenge. However, following the techniques described further below, a Si-channeled NMOS upper-level transistor may nevertheless include a source and a drain that is predominantly Si as the majority constituent, into which certain n-type dopants, such as, but not limited to, phosphorus, are effectively substituted at low temperatures not exceeding 450° C. As further described below, the n-type source and drain crystals may achieve such high electrical activity that a Si source and drain material having a chemical concentration of $1e^{19}$-$2e^{21}$ phosphorus atoms/cm$^3$ has a resistivity below $2e^{-9}$ ohm-cm$^2$. This low resistivity translates to low contact resistance in NMOS upper-level transistors, permitting the dimensions of the upper-level transistors to scale to smaller dimensions and/or achieve superior figures of merit.

In some alternative embodiments, the seeding channel material for n-type source and drain material is different from the seeding channel material of p-type source and drain material. For example, in some embodiments where a PMOS upper-level transistor has a Group IV channel material (e.g., Si), or a Group III-V channel material (e.g., InSb) the NMOS upper-level transistor has a Group III-V channel material (e.g., InAs). At least one majority lattice constituent for CMOS channel materials in such alternative embodiments is therefore distinct between the PMOS and NMOS transistor structures. The source and drain semiconductor alloy may not be the same as the channel material. For example, an n-type source and drain material including at least one of In or As impurity doped with Si, may have a channel material that comprises at least one alternative Group III or Group V lattice constituents (e.g., InGaAs, GaAs alloy).

As further described below, low-temperature epitaxial growth of source and drain materials during the fabrication of upper-level transistor structures may be further leveraged to fabricate upper-level transistors having highly scaled architectures. Specifically, in some embodiments, upper-level CMOS circuitry may employ upper-level NMOS and PMOS having a stacked nanowire architecture. Hence, by achieving low-temperature epitaxial source/drain material growth, the architecture of upper-level transistors becomes free of many constraints.

FIG. 1 illustrates a cross-sectional side view of a monolithic 3D IC structure 100, in accordance with some embodiments. Structure 100 illustrates a portion of a monolithic IC that includes FEOL device circuitry 120 that is over and/or on a monocrystalline substrate 101. In this example, FEOL device circuitry 120 includes a plurality of MOSFETs 181 that employ a monocrystalline semiconductor material 103 for at least a channel region of each transistor. In other embodiments, FEOL device circuitry 120 includes other types of transistors (e.g., bipolar junction transistor, etc.), or other active devices employing one or more semiconductor materials (e.g., diodes, lasers, etc.).

FETs 181 include a gate terminal 107 separated from semiconductor material 103 by a gate dielectric 109. A channel region of semiconductor material 103 separates source and drains 105. Contact metallization 111 is in contact with source and drains 105, and is separated from gate terminal 107 by an intervening dielectric 113. Any materials known to be suitable for FETs may be present in FEOL FETs 181. FETs 181 may be planar or non-planar devices. In some advantageous embodiments, FETs 181 are finFETs, but FETs 181 may also have any other multi-gate structure. FETs 181 may include one or more semiconductor materials. As one example, semiconductor material 103 is a surface layer of monocrystalline substrate 101. Substrate 101 may be any material known to be suitable for the fabrication of MOSFET (CMOS) circuitry, such as, but not limited to, group IV materials (e.g., substantially pure silicon, substantially pure germanium, and SiGe alloys that may range from predominantly Si to predominantly Ge).

FEOL device circuitry 120 may further include one or more levels of interconnect metallization 122 electrically insulated by dielectric materials 123 and 128. In the exemplary embodiment illustrated, FEOL device circuitry 120 includes metal-one (M1), metal-two (M2) and metal-three (M3) interconnect metallization levels. Interconnect metallization 122 may be any metal(s) suitable for FEOL and/or BEOL IC interconnection. Interconnect metallization 122 may be, for example, predominantly Ru, or predominantly Cu, predominantly W, or predominantly Al, etc. Dielectric material 128 has a different composition that dielectric material 123, and may be of a composition that has a higher dielectric constant than that of dielectric material 123, for example. In some examples where dielectric material 123 is predominantly silicon and oxygen (i.e., $SiO_x$), dielectric material 128 is predominantly silicon and nitrogen (i.e., $SiN_x$). In other examples, where dielectric material 123 is a low-k dielectric (e.g., carbon-doped silicon oxide, SiOC:H), dielectric material 128 is predominantly a higher-k dielectric (e.g., $SiO_2$).

BEOL device circuitry 130 is located over the FEOL device circuitry 120, with dielectric material 123 therebetween. In the illustrated examples, BEOL device circuitry 130 is CMOS circuitry that includes both an NMOS transistor structure 141 and a PMOS transistor structure 142. Because transistor structures 141 and 142 are over the FEOL device circuitry 120, they are referred to as "upper-level" transistors while transistors 181 are "lower-level" transistors. In this example, both NMOS transistor structure 141 and PMOS transistor structure 142 have a stacked multi-channel nanowire architecture. Although an advanced stacked nanowire structure is illustrated, embodiments herein are also applicable top-gate and bottom-gate transistor architectures, side-contact transistor architectures, or other architectures, with a few of these alternative architectures further described below.

NMOS transistor structure 141 includes a length of channel material 133B over a length of channel material 133A. Channel materials 133A and 133B are semiconductors. In some exemplary embodiments, channel materials 133A and 133B have substantially the same composition and crystallinity. Channel materials 133A and 133B may be both Group IV semiconductors that are substantially monocrystalline. In one example, channel materials 133A and 133B are both predominantly silicon, and are advantageously substantially pure silicon with only intrinsic impurity levels. In some such embodiments, channel materials 133A and 133B have a (100) crystal orientation relative to the plane of substrate 101. In alternative embodiments, channel materials 133A and 133B are both a substantially monocrystalline Group III-V semiconductor alloy.

A gate electrode 137 is between the lengths of channel materials 133A and 133B. Gate electrode 137 is also below the length of channel material 133A and above the length of channel material 133B in this cross-sectional view as gate electrode 137 wraps around each length of channel material 133A and channel material 133B. Gate electrode 137 may include an elemental metal layer, a metal alloy layer, or laminate structure of either or both elemental and alloy layers. Gate electrode 137 may have any composition suitable for the composition of channel materials 133A and 133B. In some embodiments, gate electrode 137 is a metal nitride, such as TiN. Gate electrode 137 may also comprise Al (e.g., TiAlN). Other alloy constituents may also be employed in gate electrode 137, such as, but not limited to C, Ta, W, Pt, and Sn.

A gate dielectric 139 separates gate electrode 137 from channel materials 133A and 133B. Gate dielectric 139 may be any material(s) compatible with channel materials 133A, 133B and gate electrode 137. Together, gate electrode 137 and gate dielectric 139 are referred to herein as a gate stack. While any gate stack materials known to be suitable for a particular channel material may be utilized, in some exemplary embodiments the gate stack includes a high-k dielectric material (e.g., with a bulk relative permittivity greater than 7.5), and a metal gate electrode having a work function suitable for the channel material composition. Exemplary high-k materials include dielectric metal oxides. In some examples, gate dielectric 139 comprises oxygen and at least one of Hf (e.g., $HfO_2$), Al (e.g., $Al_2O_3$), Zr (e.g., $ZrO_2$), Y (e.g., $Y_2O_3$), Ta (e.g., $Ta_2O_5$), or Ti (e.g., $TiO_2$). Silicates, such as, but not limited to $HfSiO_x$, or $TaSiO_x$ may also be suitable. In other embodiments gate dielectric 139 is $SiO_2$, or SiON.

NMOS transistor structure 141 further comprises source and drain materials 135A in contact with a sidewall of the length of channel material 133A, and a source and drain materials 135B in in contact with a sidewall of the length of channel material 133B. The length of channel material 133A is therefore between source and drain materials 135A while the length of channel material 133B is between source and drain materials 135B. As shown, sources and drain materials 135A and 135B are separate crystals, illustrated with facets to emphasize their crystallinity associated with being epitaxial to the monocrystalline sidewall surface of channel materials 133A, 133B from which they were grown. As epitaxial, sources and drain materials 135A, 135B may be advantageously substantially monocrystalline. Source and drain materials 135A, 135B have the same crystal orientation as that of channel materials 133A, 133B (e.g., (100) where channel materials 133A, 133B are also (100)). Crystalline source and drain materials 135A, 135B also have crystal facets (e.g., <111> planes) indicative of a regrowth process.

Although not drawn to scale, vertical (e.g., z-dimension) separation between source and drain materials 135A and source and drain materials 135B is a feature indicative of their epitaxial growth from sidewalls of stacked channel materials 133A, 133B that are each around 10 nm in thickness (or less) and vertically separated by around 10 nm. Although source and drain materials 135A might merge with source and drain materials 135B if the vertical separation of channel materials 133A, 133B was much less than 8 nm, the advantage of having gate electrode 137 between channel materials 133A, 133B places a lower limit on the vertical separation of channel materials 133A, 133B. Note too, that the illustrated vertical separation between source and drain materials 135A and source and drain materials 135B is a feature of the small dimensions of the epitaxial material possible when the source and drain material has advantageously low resistivity. If instead source and drain material had significantly higher resistivity, a much larger epitaxial structure would be needed to provide a larger contact area to interface with contact metal 150. Such a large source drain growth would limit upper-level transistor density and might require such a long growth process that growth temperature could be even more severely restricted. Hence, vertical separation between source and drain materials 135A and source and drain materials 135B is a feature indicative of a source and drain that has very low contact resistivity and an advantageously short growth time.

Source and drain materials 135A may have the same composition as source and drain materials 135B, which enables source and drain materials 135B to be epitaxially grown concurrently with source and drain materials 135A. Sources and drain materials 135A, 135B may have any of the n-type semiconductor compositions introduced above. For example, in some embodiments where channel materials 133A, 133B are substantially pure silicon, sources and drain materials 135A, 135B are also predominantly silicon with the only other constituent of significant concentration being one or more n-type impurities (e.g., phosphorus). In alternative embodiments where channel materials 133A, 133B are other than Si (e.g., a Group III-V alloy), sources and drain materials 135A, 135B are also other than Si (e.g. a Group III-V alloy doped with Si).

NMOS transistor structure 141 further includes source and drain contact metal 150, which makes contact to both source and drain material 135A and source and drain materials 135B. Hence, contact metal 150 electrically couples source and drain materials 135A and in electrical parallel with source and drain material 135B, while gate electrode 137 is similarly coupled to channel materials 133A and 133B in electrical parallel. The stacked nanowire architecture therefore can offer higher drive currents than a single channeled device, for example. Contact metallization 150 may have any composition suitable for the composition of sources and drain materials 135A and 135B.

PMOS transistor structure 142 has substantially the same stacked nanowire structure as NMOS transistor structure 141. PMOS transistor structure 142 includes a length of channel material 134B over a length of channel material 134A. Channel materials 134A and 134B are again semiconductors. In some exemplary embodiments, channel material 134A has substantially the same composition and crystallinity as channel material 134B. In some further embodiments, channel materials 134A, 134B have a different composition than channel materials 133A, 133B. For example, channel materials 134A and 134B may be a different Group IV semiconductor than channel materials 133A, 133B. In one example where channel materials 133A and 133B are both predominantly Si, or are a first SiGe alloy, channel materials 134A and 134B are both predominantly Ge, or a second SiGe alloy. As described further below, NMOS and PMOS structures 141 and 142 may be readily integrated from a single starting material stack that includes all of channel materials 133A, 134A, 133B and 134B. One indication the transistor structures originated from such a starting material is the vertical positions of channel materials 133A, 133B relative to channel materials 134A, 134B. As shown in FIG. 1, for example, channel material 134B is at a first height H from an underlying reference plane (e.g., any metallization level). Channel material 134A is at some other height, below height H. Channel material 133B is at another height, between height H and that of channel material 134A. The height of channel material 134A is similarly between the heights of channel materials 133B and 133A. Between NMOS and PMOS structures 141 and 142, the relative heights of gate electrodes 137 and 138 similarly vary. For example, with gate electrode 137 being at height H for NMOS structure 141.

In some other embodiments where channel materials 134A, 134B have a different composition than channel materials 133A, 133B, channel materials 134A and 134B may be a different Group III-V alloy than that of channel materials 133A, 133B. In one example where channel materials 133A and 133B are both GaAs or InAlAs, or InGaAs, channel materials 134A and 134B are both GaSb, InAlSb, or InGaSb. For these embodiments also, NMOS and PMOS structures 141 and 142 may be readily integrated from a single starting material stack that includes all of channel materials 133A, 134A, 133B and 134B. The vertical positions of channel materials 133A, 133B relative to channel materials 134A, 134B may again be as illustrated in FIG. 1, for example.

In other alternative embodiments, channel materials 134A, 134B have substantially the same composition that channel materials 133A, 133B. For example, channel materials 134A and 134B may be the same Group IV semiconductor as channel materials 133A, 133B. In one example where channel materials 133A and 133B are both predominantly Si, channel materials 134A and 134B are both predominantly Si. For such embodiments, channel materials 134A, 134B may be at substantially the same vertical heights as channel materials 133A, 133B, respectively. For these embodiments too, NMOS and PMOS structures 141 and 142 may have been integrated from a single starting material stack. For example, channel materials 133A and 134A may both originate from the same single layer within a stack while channel materials 133B and 134B may both originate from another single layer within the stack. Some intervening sacrificial material may separate two such layers of channel material, and is ultimately replaced by a gate electrode stack.

PMOS transistor structure 142 further includes a gate electrode 138 and gate dielectric 139. The composition of gate electrode 138 may be the same or different from gate electrode 137. For example gate electrode 138 may include a different work function metal than that of gate electrode 137. However, any of the attributes of gate electrode 137 and gate dielectric 139 described above in the context of NMOS transistor structure 141 are otherwise similarly applicable to PMOS transistor 142.

PMOS transistor structure 142 further comprises source and drain materials 136A in contact with a sidewall of the length of channel material 134A, and a source and drain materials 136B in in contact with a sidewall of the length of channel material 134B. The length of channel material 134A is therefore between source and drain materials 136A, and the length of channel material 134B is between source and drain materials 136B. As shown, sources and drain materials 136A and 136B are again separate crystals, illustrated with facets to emphasize their crystallinity associated with being epitaxial to the monocrystalline sidewall surface of channel materials 134A, 134B from which they were grown. As epitaxial, sources and drain materials 136A, 136B may be advantageously substantially monocrystalline with the same crystal orientation as that of channel materials 134A, 134B (e.g., (100) where channel materials 134A, 134B are also (100)). Faceting (e.g., <111> planes) are again indicative of a regrowth.

Although not drawn to scale, vertical (e.g., z-dimension) separation between source and drain materials 136A and source and drain materials 136B is a feature indicative of their epitaxial growth from sidewalls of stacked channel materials 134A, 134B that are each around 10 nm in thickness (or less) and vertically separated by around 10 nm. Although source and drain materials 136A might merge with source and drain materials 136B if the vertical separation of channel materials 134A, 134B was much less than 8 nm, the advantage of having gate electrode 137 between channel materials 134A, 134B places a lower limit on the vertical separation of channel materials 134A, 134B. Note too, that the illustrated vertical separation between source and drain materials 136A and source and drain materials 136B is a feature of the small dimensions of the epitaxial material possible when the source and drain material has advantageously low resistivity. If instead source and drain material had significantly higher resistivity, a much larger epitaxial structure would be needed to provide an interface with contact metal 150 of larger contact area.

Source and drain materials 136A advantageously have the same composition as source and drain materials 136B, which enables source and drain materials 136B to be epitaxially grown concurrently with source and drain materials 136A. Sources and drain materials 136A, 136B may have any of the p-type semiconductor compositions introduced above. For example, in some embodiments where channel materials 134A, 134B are substantially pure silicon, sources and drain materials 136A, 136B are also predominantly silicon with the only other constituent of significant concentration being one or more p-type impurities (e.g., boron). In another example, in some embodiments where channel materials 134A, 134B are substantially pure silicon, sources and drain materials 136A, 136B are predominantly Ge, or an alloy of GeSn, with the only other constituent of significant concentration being one or more p-type impurities. In another example, in some embodiments where channel materials 134A, 134B are substantially pure silicon, sources and drain materials 136A, 136B are a SiGe alloy that may be predominantly Ge, or Si, with the only other constituent of significant concentration being one or more p-type impurities. In alternative embodiments where channel materials 134A, 134B are other than Si (e.g., a Group III-V alloy), source and drain materials 136A, 136B are other than Si (e.g. SiGe, Ge, GeSn, or another Group III-V alloy) with the only other constituent of significant concentration being one or more p-type impurities.

PMOS transistor structure 142 further includes source and drain contact metal 150, which makes contact to both source and drain materials 136A and source and drain materials 136B. Hence, contact metal 150 electrically couples source and drain materials 136A in electrical parallel with source and drain materials 136B while gate electrode 137 is similarly coupled to channel materials 134A and 134B. Contact metallization 150 may again have any composition suitable for the composition of sources and drain materials 136A and 136B, and as such, may be of same or different composition as the contact metal coupled to NMOS transistor structure 141.

As further illustrated in FIG. 1, BEOL circuitry may comprise any number of metallization levels, such as a metallization level (e.g., M5 and M6) above the metallization level (e.g., M4) at which upper level transistor structures reside. Any number of interconnect metallization levels may couple BEOL circuitry 130 to the underlying FEOL device circuitry 120. In the example shown in FIG. 1, metallization levels of BEOL circuitry (e.g., M6) may be routed down through any number of metallization levels (e.g., M5-M3) to be in electrical communication with one or more FEOL transistors 181.

In further embodiments, there may be multiple levels of BEOL device circuitry 130 located over the FEOL device circuitry 120, each with dielectric material therebetween. Each level of BEOL device circuitry 130 may include a plurality of NMOS and PMOS transistor structures 141, 142. In other embodiments, a 3DIC may include multiple levels of the BEOL device circuitry 130 without any monocrystalline FEOL transistors. For such embodiments, the multiple levels of NMOS and PMOS transistor structures 141, 142 may be over any substrate (e.g., polymer, glass, etc.).

Figure 2:
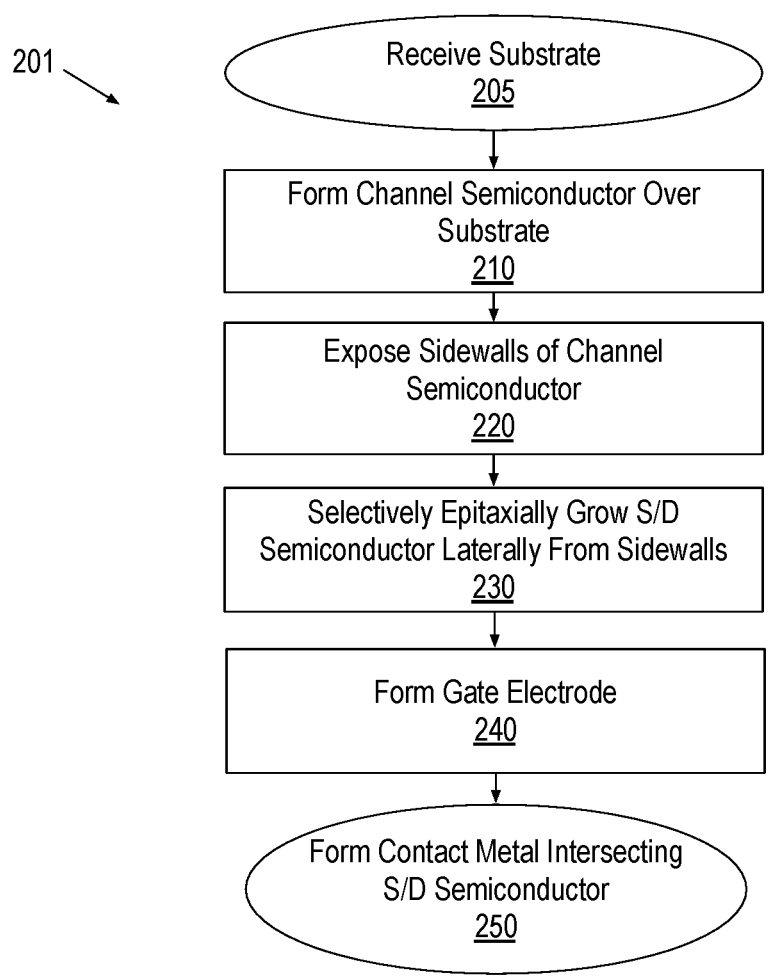
FIG. 2 is a flow diagram illustrating methods of fabricating upper-level transistor structures over lower-level integrated circuitry, in accordance with some selective epitaxy embodiments.

FIG. 2 is a flow diagram illustrating fabrication methods 201 suitable for forming upper-level transistors with epitaxial source and drain material, in accordance with some exemplary embodiments. FIG. 3A-3I are cross sectional views showing upper-level transistor structures evolving to include epitaxial source and drain materials, in accordance with some embodiments of methods 201 suitable for forming the PMOS and NMOS transistor structures 141, 142 (FIG. 1).

Referring first to FIG. 2, methods 201 begin at block 205 where a substrate is received. The substrate may advantageously include a monocrystalline semiconductor layer, such as a silicon layer, upon which front-end-of-line (FEOL) FETs may have been fabricated, for example upstream of methods 201. The substrate received may include FEOL FETs of any architecture that have been fabricated using any technique, and that are interconnected with one or more metallization levels to form FEOL circuitry. In some embodiments, the FEOL FETs include both n-type and p-type FETs interconnected into a CMOS FEOL circuit. Alternatively, the substrate received at block 205 may include back-end-of-line (BEOL) transistor layers over which an additional BEOL transistor layer may be formed in subsequent blocks of methods 201.

At block 210, one or more channel semiconductor material layers are formed over the substrate. The material formed at block 210 may have any composition that is suitable for a channel region of a PMOS and/or NMOS transistor, and is therefore referred to herein as "channel material." In some embodiments, the channel material is monocrystalline and may have any of the compositions described above, for example. Monocrystalline material may be transferred from a suitable donor substrate to the host substrate that was received at block 205. The transferred material layer(s) may include channel material that was formed on the donor substrate. In the example further illustrated in FIG. 3A, a host substrate includes FEOL circuitry 120. For clarity, only an upper dielectric material 123 and upper interconnect metallization feature 122 is shown. A donor substrate 301 supports a monocrystalline semiconductor material stack 330 that includes a plurality of NMOS channel material layers interleaved with a plurality of PMOS channel material layers. In the illustrated example, two NMOS channel layers 333A, 333B are interleaved with two PMOS channel layers 334A, 334B. The number of channel material layers may vary from one to significantly greater than the four illustrated in FIG. 3A (e.g., 10-20 channel material layers). Any layer transfer process may be performed to transfer channel material from donor substrate 301 to over FEOL circuitry 120 of the host substrate.

Figure 3A:
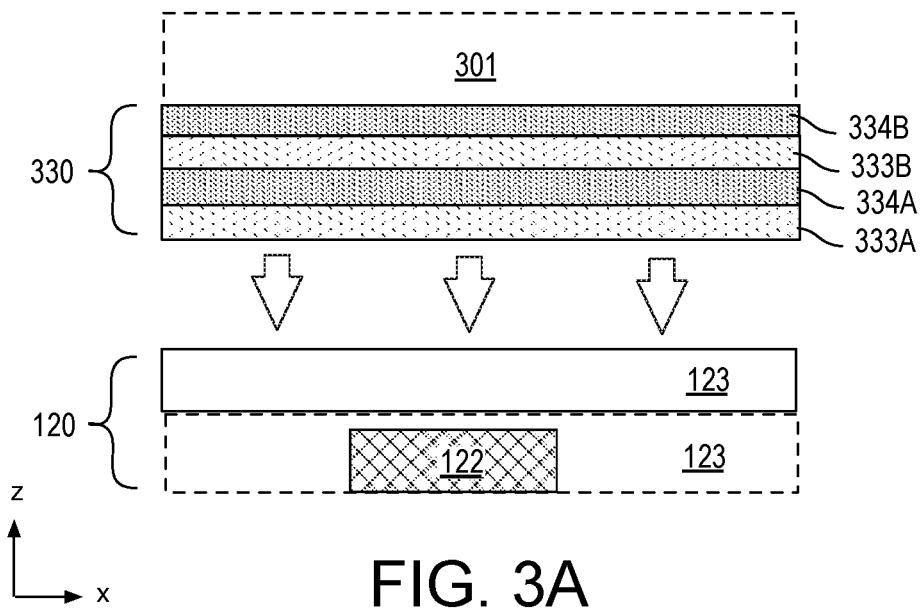
FIGS. 3A, 3B, 3C, 3D, 3E, 3F, 3G, 3H, and 3I are cross sectional views showing upper-level transistor structures evolving to include epitaxial source and drain materials, in accordance with some embodiments.
Figure 3B:
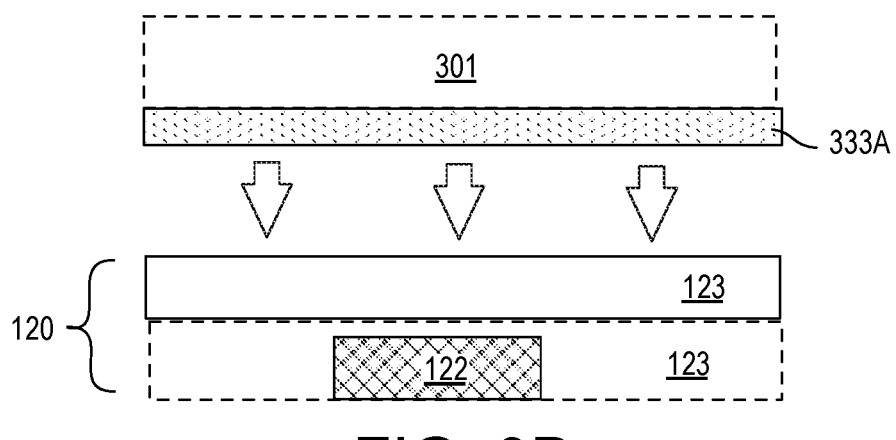
Figure 3C:
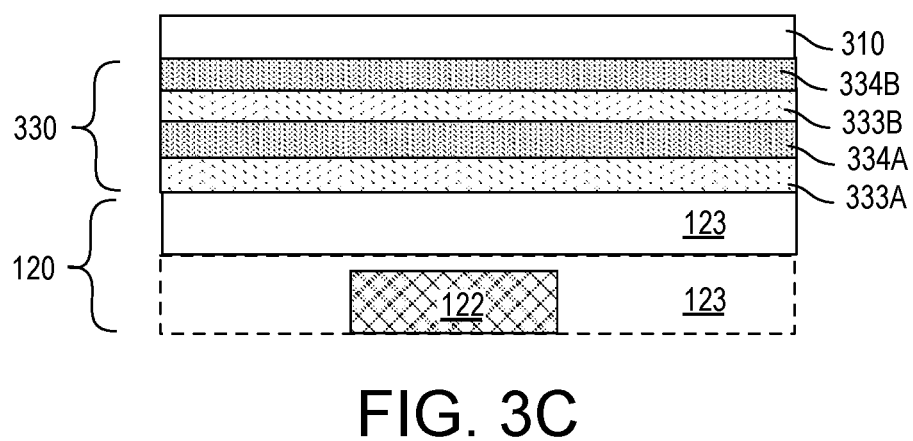

Alternatively, a transferred material layer(s) may include a monocrystalline seed layer that is formed on a donor substrate, and once transferred to the host, the seed layer may be used to subsequently grow channel material. FIG. 3B further illustrates one example where one NMOS channel material layer 333A is transferred from donor substrate 301 to over FEOL circuitry 120 of the host substrate. Subsequently, additional channel material layers of semiconductor material stack 330 are epitaxially grown directly over FEOL circuitry 120 of the host substrate. As noted above, processing temperatures are not to exceed 450° C. on the host substrate, so any processing required to form the channel material layer(s) that exceeds this threshold should be performed on the donor substrate. Whether a channel material stack is transferred (as shown in FIG. 3A), or partially grown from a transferred seed layer (as shown in FIG. 3B), one or more cap materials 310 (e.g., as shown in FIG. 3C) may be formed over the material stack 330 in preparation for subsequent processing. Cap material(s) 310 may be any dielectric material, for example.

Returning to FIG. 2, methods 201 continue at block 220 where channel material is patterned to form a sidewall surface from which source and/or drain material can be epitaxially grown. Block 220 is therefore to, at least in part, define the extent of a transistor's channel region. In some embodiments, channel material may be etched while masked by any suitable sacrificial or permanent feature. In some embodiments, recesses etched at block 220 are masked by a sacrificial structure, such as, but not limited to a sacrificial gate mandrel.

Figure 3D:
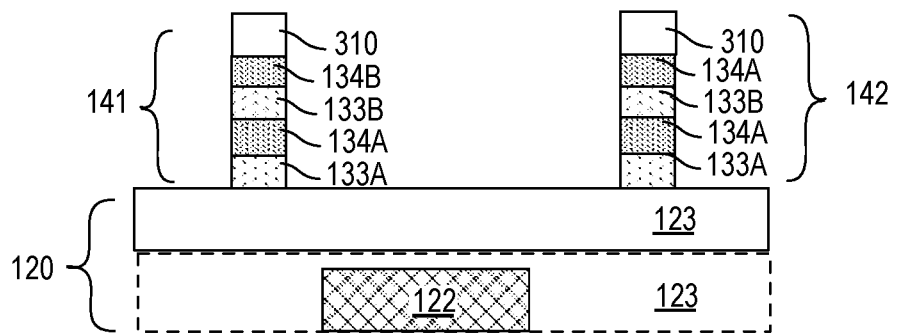
Figure 3E:
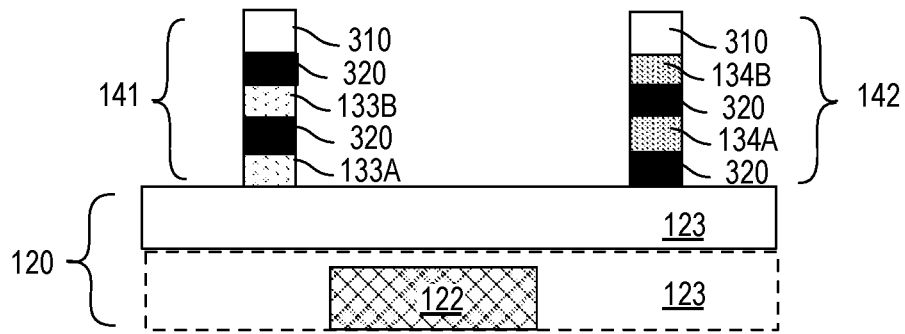
Figure 3F:
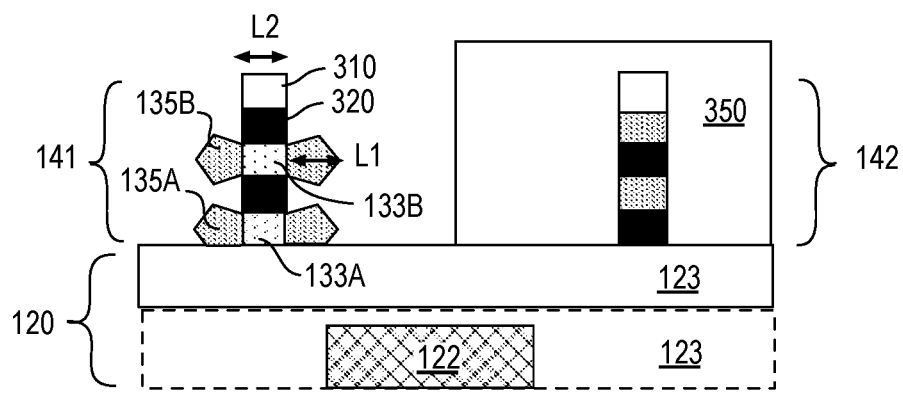

FIG. 3D further illustrates an example where channel material stack 330 has been etched into two features corresponding to NMOS and PMOS transistor structures 141, 142. At this point, a selective channel replacement may be practiced for embodiments where NMOS and PMOS channel materials are to be distinct. Selective channel replacement may be performed separately for each of NMOS and PMOS transistor structures 141, 142, for example by alternately masking the structures while the other is processed. Selective channel replacement may proceed with masking a portion of transistor structures 141, 142 and isotropically etching one of the channel materials from between the other of the channel materials. During the etching of one of the channel materials, opposite ends of the channel serve as anchor points (out of the plane of FIG. 3D). Once a channel material is removed, an amorphous or polycrystalline material 320 may be conformally deposited, for example by CVD or ALD, to backfill the region where one of the channel materials had been selectively removed, as further illustrated in FIG. 3E. Although the composition of material 320 may vary, in some examples it is polycrystalline silicon, germanium, or SiGe. For alternative embodiments, where NMOS and PMOS channel materials are substantially the same, selective channel replacement is unnecessary.

Returning to FIG. 2, methods 201 continue at block 230 where source and drain material is epitaxially grown from exposed sidewall surfaces of the channel material. In exemplary embodiments, source and drain growth at block 230 is performed so that FEOL circuitry 120 does not exceed 450° C. The low temperature epitaxial growth of source and drain material at block 230 may be made selective, for example with more material forming upon a monocrystalline seeding surface than is formed over an amorphous or polycrystalline (non-seed) material. Any of the source and drain materials described above may be grown at block 230. In some exemplary embodiments further illustrated in FIG. 3F, source and drain materials 135A, 135B are selectively grown on sidewalls of channel material 133A, 133B while PMOS transistor structure 142 is masked with a mask material 350. Source and drain materials 135A, 135B may grow as separate crystals to a diameter L1 of 15 nm, or less. As such, each source and drain crystal may have a diameter L1 that is smaller than channel length L2. As shown, the separate crystals have facets along fast growing planes (e.g., <111> for silicon embodiments). These facets are non-parallel to channel lengths 133A, 133B.

In accordance with some embodiments, source and drain materials 135A, 135B comprise predominantly silicon and one or more n-type impurities or dopants. Although silicon-based heavily doped semiconductor material is usually formed at temperatures over 800° C., the inventors have found that a low temperature (e.g., T<450 C) epitaxial growth from a crystalline seed surface can be performed successfully with chemical vapor deposition (CVD). In some embodiments, one precursor is a silicon source gas, which may be silane or higher order silane (e.g., disilane, or tetrasilane). In some phosphorus-doped embodiments, the silicon source is co-flown with phosphine. While phosphine may be particularly well-suited to forming low resistivity silicon at low growth temperatures, other dopant species (e.g., As) may also be amendable to a similar growth technique. The epitaxial growth is advantageously performed at a relatively high process pressure, for example in the range of 50-800 Torr. Such process parameters have been found to generate conformal growths with phosphorus chemical concentrations ranging between 1e19-2e21 atoms/$cm^3$. At the low growth temperature, this range of chemical concentration has been found to have sufficiently high electrical activity for source and drain materials 135A, 135B to have low resistivity (e.g., no more than 2e-9 ohm-cm2).

Hence, chemical analysis (e.g., secondary ion mass spectrometry) in conjunction with electrical analysis (e.g., a spreading resistance probe measurement, electrical s-parameter measurements) may be employed to characterize a source/drain material in accordance with embodiments here.

It has been further noted by the inventors that following a low-temperature growth, resistivity of the source and drain material may increase (e.g., electrical activity degrades) if exposed to processing temperatures higher than the source/drain epitaxial growth temperature. Although not bound by theory, it is currently thought that when exposed to higher temperatures the dopant (e.g., phosphine) may migrate and agglomerate in a manner that reduces electrical activity of the dopant.

In some advantageous embodiments, the doped silicon epitaxial growth is made selective with a cyclical growth and etch-back technique in which one cycle includes both a growth phase and an etch-back phase. Any number of such cycles may be performed with the duty cycle between the growth and etch-back phases being tunable. During the etch-back period, one or more of the gaseous precursors are switched to a chlorinated source (e.g., HCl, $SiCl_4$, $GeCl_4$, etc.). The chamber pressure, process temperature, and/or gaseous precursors may be tuned so that the etch rate is higher for amorphous Si:P than for crystalline Si:P. Hence, any material formed on surfaces of amorphous or polycrystalline material 320 and/or on surfaces of mask material 310 or dielectric 123, etc. during the growth phase may be selectively removed during the etch-back phase. The inventors have further found that Germane precursors may accelerate the etch rate of amorphous Si:P, and so the etch-back phase may enlist a gaseous precursor further comprising Ge. For such embodiments, residual Ge may be detectable within source and drain materials 135A, 135B. The level of Ge impurity would however be well below that of phosphorus in Si:P embodiments.

In some embodiments, source and drain materials 135A, 135B have a composition that differs from the composition of channel material 133A, 133B by only a greater impurity dopant concentration. For such embodiments, a homojunction is formed between channel material 133A, 133B and source and drain materials 135A, 135B. In other embodiments where channel material 133A, 133B is a Group III-V material, source and drain material 135A, 135B grown at block 230 may comprise the same Group III and Group V majority constituents as the channel (e.g., InGaAs, GaAs, GaSb, InGaSb), along with additional impurity dopant. In alternative embodiments where a heterojunction is formed between channel material 133A, 133B and source and drain materials 135A, 135B, the majority lattice constituents of source and drain material 135A, 135B grown at block 230 may differ from those of channel material 133A, 133B. The majority lattice constituents may be selected to reduce the activation energy of the impurity dopant introduced in-situ, or for otherwise achieving a lower source/drain material resistance (e.g., through a reduced bandgap). Hence, in some embodiments where channel material 133A, 133B comprises a first Group III-V alloy, source and drain material 135A, 135B grown at block 230 comprises a second Group III-V alloy.

Figure 3G:
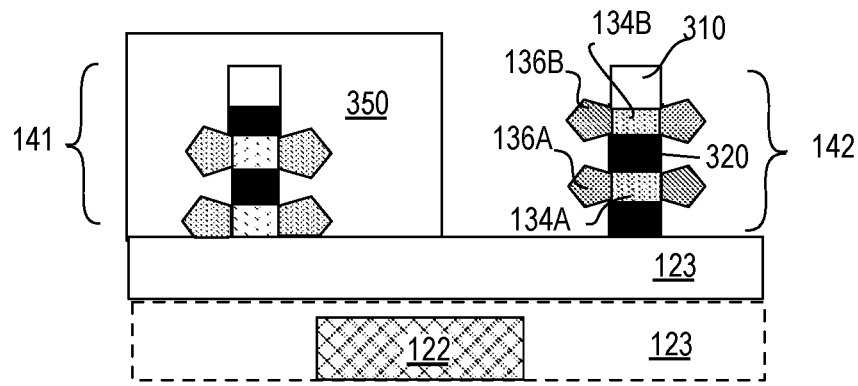

Epitaxial growth of source and drain material at block 230 may further comprise the selective growth of crystalline p-type semiconductor material on sidewalls of channel material of a PMOS transistor structure. FIG. 3G further illustrates an exemplary PMOS epitaxial growth performed while NMOS transistor structure 141 is masked by mask material 350. Epitaxial growth of source and drain materials 136A, 136B may also be made selective with more material forming upon a monocrystalline seeding surface than is formed over an amorphous or polycrystalline (non-seed) material surface. Any of the materials described above may be grown at block 230. As for n-type source and drain materials, the growth of p-type source and drain materials may be made selective with a cyclical growth and etch-back technique in which one cycle includes both a growth phase and an etch-back phase. Any number of such cycles may be performed with the duty cycle between the growth and etch-back phases being tunable. Hence, any material formed on surfaces of amorphous or polycrystalline material 320 and/or on surfaces of mask material 310 or dielectric 123 etc. during the growth phase may be selectively removed during the etch-back phase.

In some embodiments, Ge, SiGe, or GeSn is grown at block 230 as source and drain materials 136A, 136B at a temperature of 350-450° C. Substantially pure Ge and GeSn alloys have an advantageously low energy of bond formation and a p-type impurity, such as B or Ga, may be introduced as the in-situ dopant to render the deposited material p+ doped. Source and drain materials 136A, 136B may similarly grow as separate crystals, for example to a diameter of 15 nm, or less. Many low-temperature Ge-based growth processes are known, and any may be employed at block 230. In some alternative embodiments, formation of source and drain materials 136A, 136B comprises low temperature epitaxial growth of a Group III-V alloy. Depending on the majority constituent(s) of the source/drain material, a variety of impurity dopants are possible, such as Be for a III-V alloy (e.g., GaSb). Faceting (e.g., <111> planes for Si embodiments) may again be present, as illustrated in FIG. 3G.

Returning to FIG. 2, methods 201 continue at block 240 where a gate electrode is formed. In this "gate last" example, gate metal may be formed by selectively removing a portion of the non-channel materials surrounding the channel material. One or more materials may be selectively removed with one or more isotropic etch processes. Once these sacrificial materials have been removed, a conformal gate deposition process may be performed to form a gate dielectric and gate electrode coupled to the channel material(s). Any gate dielectric, and any gate electrode material may be deposited so as to form a gate electrode that is capacitively coupled to the channel material. The gate stack may be formed over, under, or adjacent to a sidewall of the channel material.

Figure 3H:
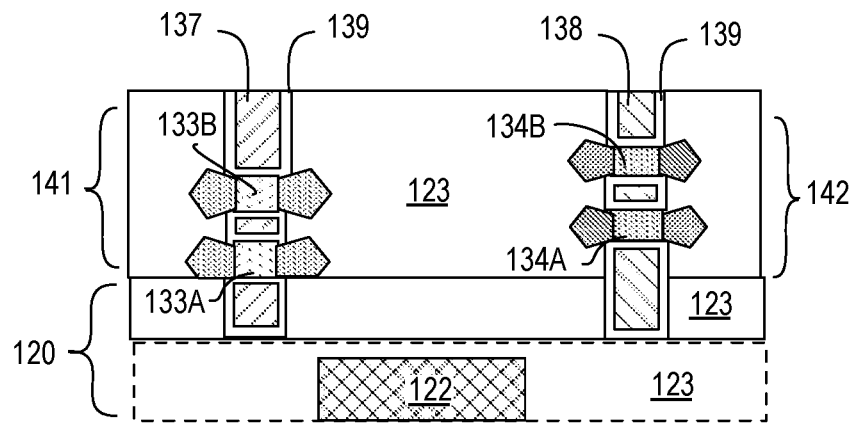
Figure 3I:
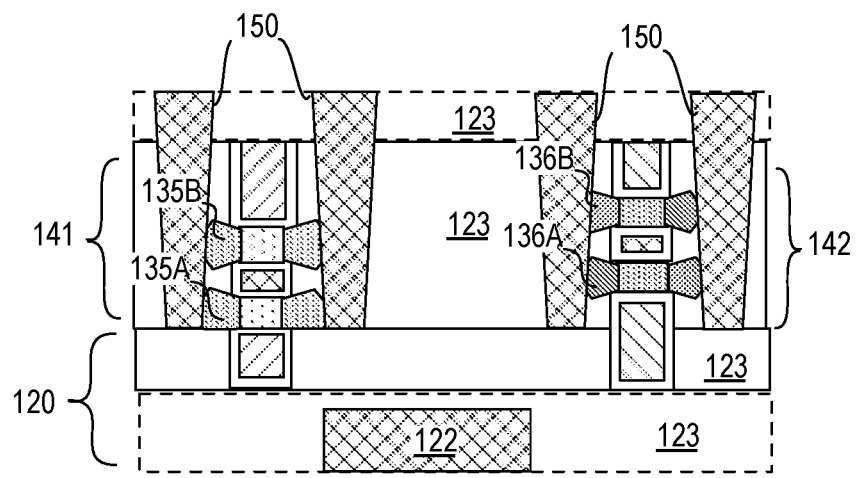

In the example further illustrated in FIG. 3H, a gate stack comprising gate dielectric 139 and gate electrode 137 is formed at least between channel materials 133A and 133B in NMOS transistor structure 141. A gate stack comprising gate dielectric 139 and gate electrode 138 is similarly formed at least between channel materials 133A and 133B in PMOS transistor structure 142. PMOS and NMOS structures 141, 142 may be alternately masked during a gate replacement process if gate electrodes 137, 138 have different compositions. Any CVD or ALD process(es) may be employed to form any suitable gate dielectric material(s) and gate electrode materials.

Returning to FIG. 2, methods 201 complete at block 250 where contact metallization is formed to the source or drain materials. Any number of dielectric materials may be deposited over the transistor structures, planarized and then any suitable contact or via etch performed to expose the epitaxial source and drain materials for each transistor structure. Contact metallization may be deposited by any means as embodiments herein are not limited in this respect. The contact metallization may be deposited by PVD, CVD, or ALD, for example. The contact metallization may also be deposited by electrolytic or electroless plating. In some exemplary embodiments, at least one of Ti, Cu, Ta, Co, Ni, Pt, Pd, or Al is deposited directly on the source and/or drain material. Any of these metals, an alloy including two or more of these metals, or a compound further including nitrogen (e.g., TiN or TaN) may form a thermally stable, low-resistance contact to both n-type and p-type source and drain material. In the example further illustrated in FIG. 3I, contact metal 150 extends through at least some of dielectric materials 123 with at least a sidewall of individual features of contact metal 150 intersecting a corresponding source and drain crystal. In the example illustrated where there are multiple source and drain crystals in a vertical stack, contact metal 150 intersects each source and drain crystal (e.g. 135A, 135B), coupling together the otherwise electrically isolated crystals.

Following the fabrication of the NMOS and PMOS transistor structures 141, 142, monolithic fabrication may continue with the formation of any number of additional back end interconnect metallization levels (e.g., to arrive at the 3DIC structure illustrated in FIG. 1). For example, terminals of multiple transistor structures 141, 142 may be coupled into BEOL circuitry 130. In some further embodiments, BEOL circuitry 130 is electrically interconnected to FEOL circuitry 120 through one or more interconnect metallization levels.

Figure 4:
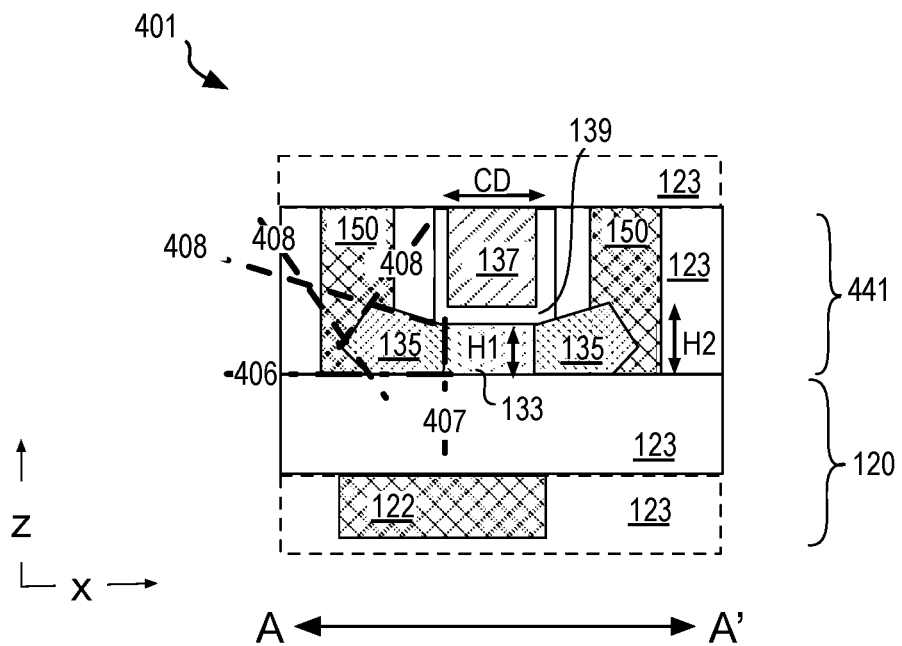
FIGS. 4 and 5 are cross sectional views of upper-level transistor structures including epitaxial source and drain materials, in accordance with some alternative embodiments.

Methods 201 (FIG. 2) may be applied to other transistor structures, which may be similarly incorporated into a monolithic 3DIC. For example, instead of a nanowire architecture, an upper-level transistor may have either a "top-gate" or "bottom-gate" architecture. FIG. 4 illustrates an exemplary 3DIC structure 401 that includes an NMOS upper transistor structure 441 comprising a top-side gate electrode 137 along with top-side source and drain contact metallization 150. Channel material 133 may be any of those materials described above in the context of FIG. 1 and/or FIG. 2. Dielectric material 123 is again over substrate FEOL circuitry 120. Source and drain contact metallization 150 is embedded within a dielectric material 123.

In the top gate configuration, gate dielectric 139 is over channel material 133, and gate electrode 137 is over gate dielectric 139. Gate dielectric 139 and gate electrode 137 may have any of the compositions described above. Channel material 133 has a lateral (e.g., x-dimension) gate length that is dependent on the spacing of epitaxial source or drain materials 135. Epitaxial source or drain material 135 separates contact metallization 150 from channel material 133. Channel material 133, as well as source and drain material 135, may have any of the compositions described above in the context of FIG. 1 or 2 (FIG. 3A-3G). As noted above, channel material 133 is advantageously monocrystalline while source or drain material 135 may be similarly monocrystalline, having been seeded from channel material 133. In some advantageous NMOS embodiments, source and drain material 135 comprises n-type Si (e.g., Si:P), for example grown substantially as described above. Any of the other compositions of source and drain material 135 described above are also possible.

Transistor structure 401 may be fabricated according to a variety of techniques. In some embodiments, methods 201 are employed, for example with channel material 133 transferred to dielectric material 123. Gate stack materials, or a sacrificial mandrel material, may then be deposited over channel material 133 and patterned into a gate mask. Channel material 210 may then be etched away where not protected by the gate mask. Source or drain material 135 may be epitaxially grown from exposed surfaces of channel material 133, for example with any of the low-temperature growth techniques described above in the context of methods 201 (e.g., block 230, FIG. 2). Where the epitaxial process is sufficiently selective, source or drain material 135 grows as a crystal from the sidewalls of channel material 133 without accumulating on sidewalls of the gate mask.

As further shown, channel material 133 has a sidewall of a height H1 as measured from dielectric material 123 (e.g., from channel material plane 406). Source or drain material 135 are epitaxial to channel material 133, extending from the sidewall of height H1 as separate crystals having a same crystal orientation as channel material 133. Source or drain material 135 have grown to a height H2 that exceeds height H1. Source and drain material 135 have one or more sidewall facets 408 that are non-orthogonal and non-parallel to channel material plane 406 and/or non-parallel and non-orthogonal to device structure sidewall 407. For example, sidewall facets 408 may be along <111> planes (45 deg.) where channel material plane 406 defines a (100) plane and source and drain material 135 has a cubic lattice. As noted above in the context of FIGS. 3F and 3G, such faceting of source and drain material 135 is indicative of source and drain material 135 having been formed by an additive (epitaxial growth) process subsequent to the patterning of sidewalls into channel material 133. Such faceting and differences in heights H1 and H2 would be absent if instead source and drain material 135 had been patterned from channel material 133 through a subtractive patterning process.

Following growth of source or drain material 135, additional dielectric material 123 may be deposited over source or drain material 135, and planarized with the gate mask. If the gate mask was a sacrificial mandrel material, it may then be replaced with gate dielectric 139 and/or gate electrode 137. Contact openings may be etched to expose a portion of source and drain materials 135, and contact metallization 150 may then be deposited into the openings to complete NMOS upper-level transistor structure 441. Similar processing may be employed to monolithically fabricate a top-gate PMOS upper level transistor structure.

Figure 5:
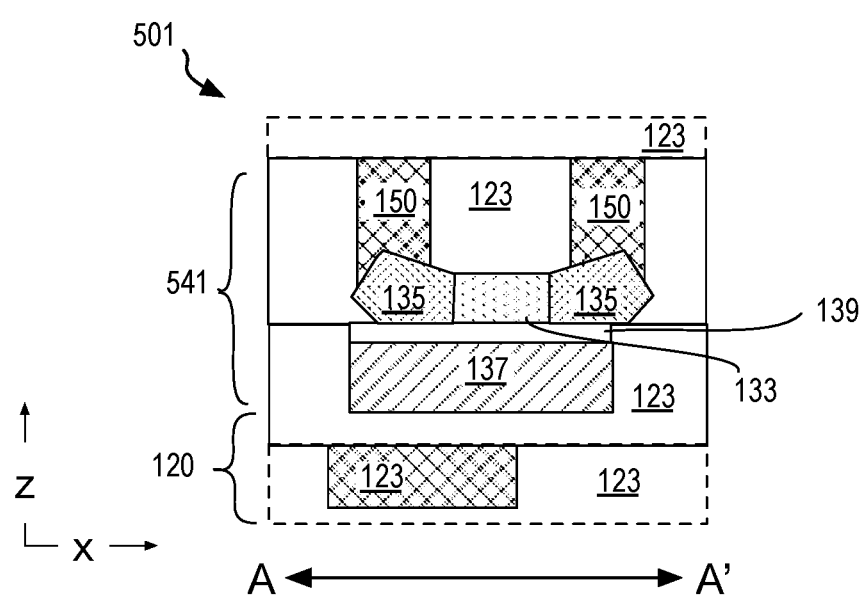

FIG. 5 illustrates another exemplary monolithic 3DIC structure 501 that includes an upper-level NMOS transistor structure 501 comprising a bottom-gate architecture. In this example, gate electrode 137 on a bottom side of channel material 133. Source and drain contact metallization 150 is on a top side of channel material 133. In transistor structure 501, gate dielectric 139 is above gate electrode 137 and below channel material 133. Gate dielectric 139 is also between gate electrode 137 and overlapped portions of source and drain material 135. Channel material 133, as well as source and drain material 135, may again have any of the compositions described above in the context of FIG. 1 or 2. As noted above, channel material 133 is advantageously monocrystalline while source and drain materials 135 may be similarly monocrystalline, having been seeded from a sidewall of channel material 133. In some advantageous NMOS embodiments, source and drain material 135 comprises n-type Si (e.g., Si:P), substantially as described above. Any of the other compositions of source and drain material 135 described above are also possible.

Transistor structure 501 may be fabricated according to a variety of techniques. In some embodiments, methods 201 are employed, for example with channel material 133 is transferred to a host substrate including gate electrode 137 and gate dielectric 139 at block 210 (FIG. 1) Channel material 133 may then be patterned in alignment with gate electrode 137 to form sidewalls from which source or drain material 135 may be epitaxially grown selectively.

Following growth of source or drain material 135, additional dielectric material 123 may be deposited over source or drain material 135, and planarized. Contact openings may be etched to expose a portion of source and drain materials 135, and contact metallization 150 may then be deposited into the openings to complete NMOS upper-level transistor structure 541. Similar processing may be employed to monolithically fabricate a bottom-gate PMOS upper level transistor structure.

Figure 6:
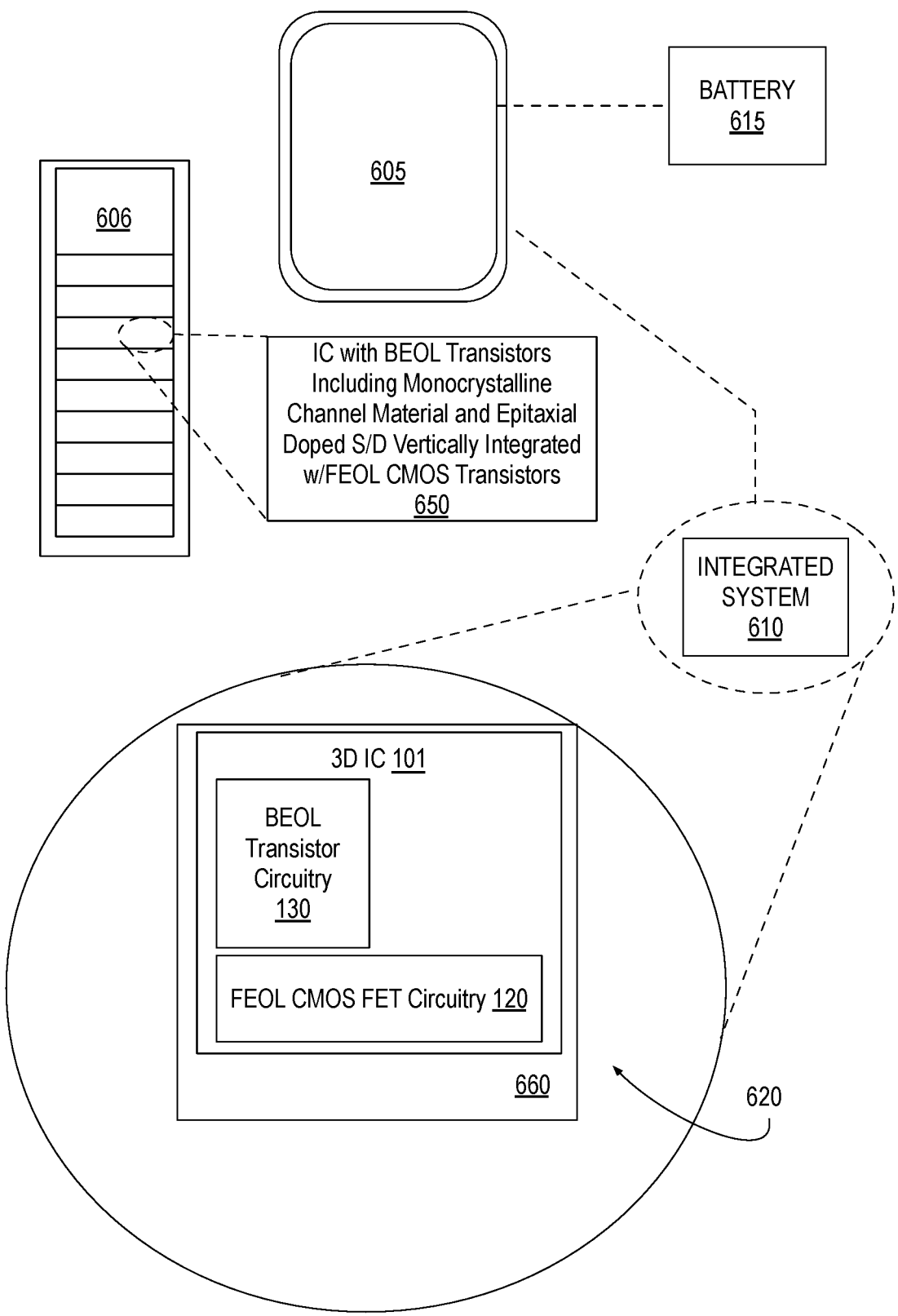
FIG. 6 illustrates a system employing a 3DIC including upper-level transistors over lower-level integrated circuitry, in accordance with some embodiments.

FIG. 6 illustrates a system in which a mobile computing platform 605 and/or a data server machine 606 employs an IC including at least one back-end semiconductor device with a monocrystalline channel material and epitaxial impurity-doped source and drain materials. Such a back-end semiconductor device may be over a front-end semiconductor device, in accordance with some embodiments. The server machine 606 may be any commercial server, for example including any number of high-performance computing platforms disposed within a rack and networked together for electronic data processing, which in the exemplary embodiment includes a packaged monolithic 3DIC 650. The mobile computing platform 605 may be any portable device configured for each of electronic data display, electronic data processing, wireless electronic data transmission, or the like. For example, the mobile computing platform 605 may be any of a tablet, a smart phone, laptop computer, etc., and may include a display screen (e.g., a capacitive, inductive, resistive, or optical touchscreen), a chip-level integrated system 610, and a battery 615.

Whether disposed within the integrated system 610 illustrated in the expanded view 620, or as a stand-alone packaged chip within the server machine 606, monolithic 3D IC structure 100 may include memory circuitry (e.g., RAM), or a logic circuitry (e.g., a microprocessor, a multi-core microprocessor, graphics processor, or the like) at least one of which further includes a transistor with a monocrystalline channel material coupled to contact metallization through epitaxial impurity doped source and drain material, for example, as described elsewhere herein. 3D IC structure 100 may further include silicon CMOS front-end circuitry 120 and BEOL transistor circuitry 130, for example having any of the attributes described elsewhere herein. The 3D IC structure 100 may be further coupled to a board, a substrate, or an interposer 660.

3D IC structure 100 may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 7:
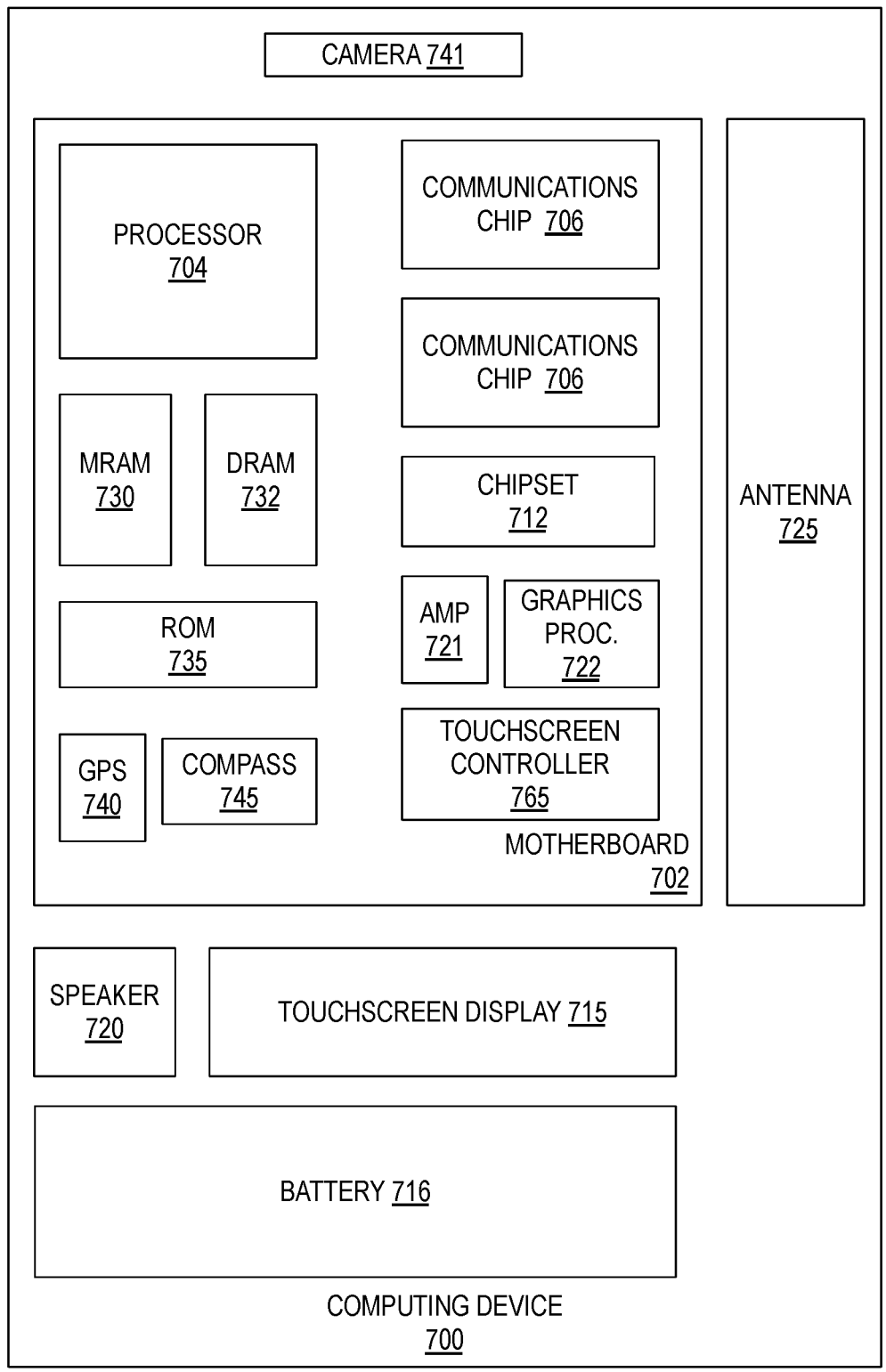
FIG. 7 is a functional block diagram illustrating an electronic computing device, in accordance with an embodiment of the present invention.

FIG. 7 is a functional block diagram of an electronic computing device 700, in accordance with some embodiments. Device 700 further includes a motherboard 702 hosting a number of components, such as, but not limited to, a processor 704 (e.g., an applications processor). Processor 704 may be physically and/or electrically coupled to motherboard 702. In some examples, processor 704 is part of a monolithic 3DIC structure, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 706 may also be physically and/or electrically coupled to the motherboard 702. In further implementations, communication chips 706 may be part of processor 704. Depending on its applications, computing device 700 may include other components that may or may not be physically and electrically coupled to motherboard 702. These other components include, but are not limited to, volatile memory (e.g., DRAM 732), non-volatile memory (e.g., ROM 735), flash memory (e.g., NAND or NOR), magnetic memory (MRAM 730), a graphics processor 722, a digital signal processor, a crypto processor, a chipset 712, an antenna 725, touchscreen display 715, touchscreen controller 765, battery 716, audio codec, video codec, power amplifier 721, global positioning system (GPS) device 740, compass 745, accelerometer, gyroscope, speaker 720, camera 741, and mass storage device (such as hard disk drive, solid-state drive (SSD), compact disk (CD), digital versatile disk (DVD), and so forth, or the like.

Communication chips 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 706 may implement any of a number of wireless standards or protocols, including, but not limited to, those described elsewhere herein. As discussed, computing device 700 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, an integrated circuit (IC) structure comprises one or more levels of metallization over one or more first transistor structures, a dielectric material over the one or more levels of metallization, and a second transistor structure. The second transistor structure comprises a channel material over the dielectric material. The channel material is monocrystalline, a source crystal and a drain crystal over the dielectric material and in contact with a sidewall of the channel material. The source crystal and drain crystal have a same crystal orientation as the channel material. The source crystal and drain crystal comprise one or more facets. A gate stack is coupled to the channel material.

In second examples, for any of the first examples the source crystal comprises a first facet non-orthogonal to the sidewall of the channel, and wherein the drain crystal comprises a second facet non-orthogonal to the sidewall of the channel.

In third examples, for any of the first through second examples the first crystal and second crystal each have a height from the dielectric material that exceeds a height of the sidewall.

In fourth examples, for any of the first through second examples the channel material comprises predominantly silicon, and the source crystal and the drain crystal both comprise silicon and one or more n-type impurities.

In fifth examples, for any of the fourth examples the n-type impurities comprise 1e19-2e21 phosphorus atoms/cm$^3$.

In sixth examples, for any of the fourth through fifth examples the source crystal and the drain crystal have a resistivity below 2e-9 ohm-cm$^2$.

In seventh examples, for any of the fourth through sixth examples through thirds examples the source crystal and the drain crystal further comprise Ge at an impurity level below that of the phosphorus.

In eighth examples, for any of the first through seventh examples the one or more levels of metallization are embedded within one or more dielectric materials having a relative permittivity below 3.5.

In ninth examples, an integrated circuit (IC) structure comprises one or more levels of metallization over one or more first transistor structures. The IC structure comprises a dielectric material over the one or more levels of metallization, and a second transistor structure over the dielectric material. The second transistor structure comprises a first layer of channel material over a second layer of the channel material with a gate electrode therebetween. The second transistor structure comprises a first crystal of a source material and a first crystal of a drain material with the first layer of the channel material therebetween. The first crystals of source and drain material are in contact with a sidewall of the first layer of the channel material. The second transistor structure comprises a second crystal of the source material and a second crystal of the drain material with the second layer of the channel material therebetween. The second crystals of source and drain material are in contact with a sidewall of the second layer of the channel material.

In tenth examples, for any of the ninth examples the first crystal of the source material is over the second crystal of the source material with a dielectric material therebetween. The first crystal of the drain material is over the second crystal of the drain material with the dielectric material therebetween.

In eleventh examples for any of the ninth through tenth examples the first crystals each comprise a facet non-orthogonal to the sidewall of the first layer of channel material, and wherein the second crystals each comprise a facet non-orthogonal to the sidewall of second layer of channel material.

In twelfth examples for any of the ninth through eleventh examples the second transistor structure further comprises a source contact metal and a drain contact metal. A sidewall of the source contact metal intersects the first and second crystals of the source material. A sidewall of the drain contact metal intersects the first and second crystals of the drain material.

In thirteenth examples, for any of the ninth through twelfth examples the source material and the drain material both comprise Si and have a resistivity below 2e-9 ohm-cm$^2$.

In fourteenth examples, a method of fabricating a transistor structure comprises receiving a substrate comprising a dielectric material over one or more levels of metallization over one or more first transistors. The method comprises forming a channel material over the dielectric material, wherein the channel material is monocrystalline. The method comprises exposing sidewalls of the channel material with a patterning process. The method comprises epitaxially growing a source crystal and a drain crystal from a sidewall of the channel material, and forming gate stack coupled with the channel material.

In fifteenth examples, for any of the fourteenth examples epitaxially growing the source crystal and the drain crystal further comprises a chemical vapor deposition (CVD) process employing both phosphine and a silane.

In sixteenth examples, for any of the fifteenth examples the CVD process is performed at a process pressure of 50-800 Torr.

In seventeenth examples, for any of the fourteenth through sixteenth examples the CVD process is performed at a temperature below 450° C.

In eighteenth examples, for any of the fourteenth through seventeenth examples the CVD process comprises an in-situ etch employing a chlorinated precursor.

In nineteenth examples, for any of the fourteenth through eighteenth examples forming a channel material further comprises transferring one or more monocrystalline semiconductor material layers from a donor substrate to a host substrate.

In twentieth examples, for any of the fourteenth through nineteenth examples, forming a channel material further comprises forming a pair of first channel material layers interleaved with a pair of second channel material layers.

In twenty-first examples, for any of the fourteenth examples exposing sidewalls of the channel material further comprises patterning the pairs of first and second channel material layers into first and second stack, replacing the pair of first channel material layers in the first stack with a sacrificial material, and replacing the pair of second channel material layers in the second stack with a sacrificial material. Epitaxially growing a source material and a drain material from the sidewalls of the channel material further comprises epitaxially growing n-type source and drain material from the pair of first channel material layers, and epitaxially growing p-type source and drain material from the pair of second channel material layers.

In twenty-second examples, for any of the twenty-first examples forming the gate stack further comprises replacing the sacrificial material within the first and second stack with the gate stack.

In twenty-third examples, for any of the fourteenth examples contacting the source and drain materials with the contact metal further comprises contacting both a first crystal and a second crystal of the p-type source material with a first feature of the contact metal, contacting both a first crystal and a second crystal of the p-type drain material with a second feature of the contact metal, contacting both a first crystal and a second crystal of the n-type source material with a third feature of the contact metal, and contacting both a first crystal and a second crystal of the n-type drain material with a fourth feature of the contact metal.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) structure, comprising:
one or more levels of metallization over one or more first transistor structures;
a dielectric material over the one or more levels of metallization; and
a second transistor structure, the second transistor structure comprising:
a channel material over the dielectric material, wherein the channel material is monocrystalline and comprises predominantly silicon;
a source crystal and a drain crystal over the dielectric material and in contact with a sidewall of the channel material, wherein the source crystal and drain crystal have a same crystal orientation as the channel material, and wherein the source crystal and drain crystal comprise one or more facets, and wherein the source crystal and the drain crystal comprise silicon and phosphorus and further comprise Ge at an impurity level below that of the phosphorus; and
a gate stack coupled to the channel material.

2. The IC structure of claim 1, wherein the source crystal comprises a first facet non-orthogonal to the sidewall of the channel, and wherein the drain crystal comprises a second facet non-orthogonal to the sidewall of the channel.

3. The IC structure of claim 2, wherein the first facet and second facet each have a height from the dielectric material that exceeds a height of the sidewall.

4. The IC structure of claim 1, wherein source crystal and drain crystal comprise 1e19-2e21 phosphorus atoms/cm$^3$.

5. The IC structure of claim 1, wherein the source crystal and the drain crystal have a resistivity below 2e-9 ohm-cm2.

6. The IC structure of claim 1, wherein the one or more levels of metallization are embedded within one or more dielectric materials having a relative permittivity below 3.5.

7. An integrated circuit (IC) structure, comprising:
one or more levels of metallization over one or more first transistor structures;
a dielectric material over the one or more levels of metallization; and
a second transistor structure over the dielectric material, wherein the second transistor structure comprises:
a first layer of channel material over a second layer of the channel material with a gate electrode therebetween;
a first crystal of a source material and a first crystal of a drain material with the first layer of the channel material therebetween, wherein the first crystals of source and drain material are in contact with a sidewall of the first layer of the channel material; and
a second crystal of the source material and a second crystal of the drain material with the second layer of the channel material therebetween, wherein the second crystals of source and drain material are in contact with a sidewall of the second layer of the channel material, wherein the source material and the drain material both comprise Si and have a resistivity below 2e-9 ohm-cm$^2$.

8. The IC structure of claim 7, wherein the first crystal of the source material is over the second crystal of the source material with a dielectric material therebetween, and wherein the first crystal of the drain material is over the second crystal of the drain material with the dielectric material therebetween.

9. The IC structure of claim 7, wherein the first crystals each comprise a facet non-orthogonal to the sidewall of the first layer of channel material, and wherein the second crystals each comprise a facet non-orthogonal to the sidewall of second layer of channel material.

10. The IC structure of claim 7, further comprising a source contact metal and a drain contact metal, wherein:
 a sidewall of the source contact metal intersects the first and second crystals of the source material; and
 a sidewall of the drain contact metal intersects the first and second crystals of the drain material.

11. A method of fabricating a transistor structure, the method comprising:
 receiving a substrate comprising a dielectric material over one or more levels of metallization over one or more first transistors;
 forming a channel material over the dielectric material, wherein the channel material is monocrystalline;
 exposing sidewalls of the channel material with a patterning process;
 epitaxially growing a source crystal and a drain crystal from a sidewall of the channel material wherein epitaxially growing the source crystal and the drain crystal further comprises a selective growth process comprising a growth phase employing both phosphine and a silane precursor, and an etch-back phase comprising a chlorinated germanium precursor; and
 forming gate stack coupled with the channel material.

12. The method of claim 11, wherein the CVD process is performed at a process pressure of 50-800 Torr.

13. The method of claim 11, wherein the CVD process is performed at a temperature below 450° C.

14. The method of claim 11, wherein forming a channel material further comprises transferring one or more monocrystalline semiconductor material layers from a donor substrate to a host substrate.

15. The method of claim 11, wherein forming a channel material further comprises forming a pair of first channel material layers interleaved with a pair of second channel material layers.

* * * * *